United States Patent
Chou et al.

(10) Patent No.: US 7,814,387 B2
(45) Date of Patent: Oct. 12, 2010

(54) CIRCUIT STATE SCAN-CHAIN, DATA COLLECTION SYSTEM AND EMULATION AND VERIFICATION METHOD

(75) Inventors: Jen-ya Chou, Shanghai (CN); Ya-lin Zhang, Shanghai (CN)

(73) Assignee: Magima Digital Information Co., Ltd., Shanhai (CN)

( * ) Notice: Subject to any disclaimer, the term of this patent is extended or adjusted under 35 U.S.C. 154(b) by 341 days.

(21) Appl. No.: 12/067,733

(22) PCT Filed: Jul. 31, 2006

(86) PCT No.: PCT/CN2006/001911
§ 371 (c)(1),
(2), (4) Date: Mar. 21, 2008

(87) PCT Pub. No.: WO2007/036117
PCT Pub. Date: Apr. 5, 2007

(65) Prior Publication Data
US 2008/0250365 A1    Oct. 9, 2008

(30) Foreign Application Priority Data
Sep. 29, 2005   (CN) .................... 2005 1 0030177

(51) Int. Cl.
*G06F 11/00* (2006.01)
*G01R 31/28* (2006.01)
(52) U.S. Cl. ...................................... 714/741; 714/726
(58) Field of Classification Search ................. 714/724, 714/725, 726, 727, 729, 733, 734, 741
See application file for complete search history.

(56) References Cited

U.S. PATENT DOCUMENTS

| | | | |
|---|---|---|---|
| 5,790,561 A * | 8/1998 | Borden et al. | 714/724 |
| 5,937,179 A | 8/1999 | Swoboda | |
| 6,356,107 B1 | 3/2002 | Tang et al. | |
| 6,446,229 B1 * | 9/2002 | Merrick et al. | 714/724 |
| 6,453,436 B1 | 9/2002 | Rizzolo et al. | |
| 6,490,702 B1 | 12/2002 | Song et al. | |
| 6,615,377 B1 * | 9/2003 | da Cruz et al. | 714/724 |

(Continued)

OTHER PUBLICATIONS

Shih-Arn Hwang; Jin-Hua Hong; Cheng-Wen Wu; , "Sequential circuit fault simulation using logic emulation," Computer-Aided Design of Integrated Circuits and Systems, IEEE Transactions on , vol. 17, No. 8, pp. 724-736, Aug. 1998 doi: 10.1109/43.712103.*

(Continued)

*Primary Examiner*—Cynthia Britt
(74) *Attorney, Agent, or Firm*—Dorsey & Whitney LLP

(57) ABSTRACT

The present invention provides a circuit state scan-chain for emulating and verifying integrated circuit design, a data collection system and an emulation and verification method using the scan-chain. The said integrated circuit includes a number of registers and the corresponding input terminal combinational logic and output terminal combinational logic. The construction of the said scan-chain includes the first multiplex module and the second multiplex module arranged with regard to each register, changing the operation mode of the said integrated circuit by controlling the first multiplex module and the second multiplex module, enabling the said integrated circuit to switch among the normal mode, holding mode and snapshot mode, and enabling the registers to form a scan-chain loop in the snapshot mode.

7 Claims, 2 Drawing Sheets

U.S. PATENT DOCUMENTS 6,751,764 B1 * 6/2004 Golshan et al. ............. 714/729
2006/0005103 A1 * 1/2006 Zhang et al. ................ 714/758

OTHER PUBLICATIONS

Chunsheng Liu; Chakrabarty, K.; , "Identification of error-capturing scan cells in scan-BIST with applications to system-on-chip," Computer-Aided Design of Integrated Circuits and Systems, IEEE Transactions on , vol. 23, No. 10, pp. 1447-1459, Oct. 2004 doi: 10.1109/TCAD.2004.833620.*

* cited by examiner

CIRCUIT STATE SCAN-CHAIN, DATA COLLECTION SYSTEM AND EMULATION AND VERIFICATION METHOD

BACKGROUND OF THE INVENTION

1. Field of the Invention

The present invention relates to a circuit state scan-chain for simulating and verifying IC designs, a data collection system with the scan-chain, and an emulation and verification method using the scan-chain.

2. Description of Prior Art

Time to market is an important factor for valuating competitiveness of Integrated circuit (IC) products. With enlarged scales of IC and development of IP reuse, emulation and verification for IC design need more time. Increasing efficiency of emulation and verification is an effective measure for shortening time for designing an IC product.

Emulation includes software simulation and hardware emulation. The software simulation inputs codes describing IC with hardware description language (for example RTL code) to a software simulation system, and simulates logic functions of the IC by software. The hardware emulation inputs the codes to a hardware emulation system (FPGA platform), and simulates logic functions of the IC on FPGA. The software simulation and the hardware emulation have different features. In software simulation, inside states are all recurred, and any signals of the design being tested (IC simulated by the software simulation system) can be detected. The design being tested can be analyzed in detail, but emulation speed is slow. The emulation speed of the hardware emulation system is fast, but inside signals are hard to be observed in restraint of the count of pins.

Debugging a design being tested needs to analyze in detail only a short period of time about the time at which errors are occurring. Thus only a small segment of the test item during which errors are occurring needs to be run on the software simulation system. The emulation and verification method, which combines the hardware emulation and the software simulation, assures detailed analysis of the design being tested and increases efficiency of emulation and verification. In short words, most of the design being tested runs on the hardware simulation system. The output signals of the hardware emulation system compare with standard output signals to determine whether errors occur. The behaviors during a short period of time about the time which errors occur are recurred to a software simulation system by reproducing circuit states and input sequences of the hardware emulation system. The software simulation system analyzes the test item in detail. This method has merits of both the hardware emulation and the software simulation.

Any single-clock synchronized digital system can be regarded as a huge state machine. The design being tested simulated by the hardware emulation system is such a system. Several conceptions are explained here:

Input sequence (abbreviated as input_seq): discrete sequence of input signals sampled by clock signals.

Output sequence (abbreviated as output_seq): discrete sequence of output signals sampled by clock signals.

State sequence (abbreviated as state_seq): discrete sequences of states sampled by clock signals.

Behavior function (behavior_function): a function generated by a state and a corresponding input sequence, with parameters of the current states and an input sequence, producing a state sequence and an output sequence.

The relation of the behavior_function, the state sequence, the input sequence and the output sequence is as follows:

(state_seq,output_seq)=behavior_function (init_state,input_seq).

Description of the formula above is: during a period of time, behaviors of the system (state_seq and output_seq) are determined only by behavior functions (behavior_function), initial states (init_state) and an input sequence (input_seq).

To recur the behaviors of the design being tested on a hardware emulation system to a software simulation system, the hardware emulation system requires the three sorts of information: behavior functions (behavior_function), initial states (init_state) and an input sequence (input_seq).

It is well known that, at any time, states of a single-clock synchronized IC are determined only by the stored data in an inside memory; its behaviors are determined only by all the inside terminal combinational logic; an input sequence is determined by outside.

The combinational logic on a hardware emulation system are the same as those on a software simulation system (at least under normal mode). In other words, the behaviors of the IC are the same on both of the two platforms. So, as long as the "initial states" and "input sequence" of the design being tested on the hardware emulation system are provided, the behaviors of the design being tested on the hardware emulation system can be retrieved in the software simulation system (that is, a state sequence and an output sequence). This is the basis of an emulation and verification method combining hardware emulation and software simulation.

In order to retrieve behaviors of the design being tested emulated by a hardware emulation system in a software simulation system, "initial state" and "input sequence" need to be obtained from the hardware emulation system firstly. "Input sequence" may be obtained by duplicating input of the design being tested. The essential problem is how to obtain initial states (In the art, the process of obtaining initial states is called snapshot.) Currently, a common method in the art is to connect the software simulation system and the hardware emulation system in some way, enabling circuit states to be transferred therebetween, and correspondingly, allowing emulation to switch therebetween. In a method as disclosed in U.S. Pat. No. 5,937,179 (abbreviated as 179 patent), in the case that an error is made to the hardware emulation system, the test item is stopped temporarily. A scan-chain constituted by backup registers outputs circuit states of the design being tested to the software simulation system. The test item is continued to run as of this moment in the software simulation system. The error is retrieved in the software simulation system and is analyzed (see Line 63, Column 3 to Line 39-43, Column 4 in the 179 patent). This emulation and verification method has the following drawbacks: the first, constructing a scan-chain with extra backup registers significantly increases numbers of the IC gates and cost of FPGA emulation, which is outstanding in super large scale IC design; the second, emulation is switched between the software simulation system and the hardware emulation system, and frequency of switching is so high that emulation efficiency decreases; the third, when errors occur to the hardware emulation system, the best time when the errors of the design being tested are analyzed has lapsed, and it is difficult, and even impossible, to retrieve the initial states at the moment by running the test item in the software simulation system.

SUMMARY OF THE INVENTION

In order to simplify emulation and verification, increase efficiency of emulation and verification, and decrease cost of emulation and verification, a new emulation and verification method is desired.

The present invention provides a circuit state scan-chain, which comprises a number of registers, and input terminal combinational logic and output terminal combinational logic corresponding to each register. An output port of each register connects with an input port of a corresponding output terminal combinational logic. Said circuit state scan-chain further comprises a number of first multiplex modules and a number of second multiplex modules respectively in correspondence with said registers. Wherein each register is involved of a corresponding first multiplex module and a corresponding second multiplex module, the first multiplex modules and the second multiplex modules respectively having two input ports and one output port. Wherein the first input port of each first multiplex module connects with the output port of a corresponding register, the second input port of each first multiplex module connecting with the output port of the previous register, the first input port of each second multiplex module connecting with the output port of the input terminal combinational logic of a corresponding register, the second input port of each second multiplex module connecting with the output port of a corresponding first multiplex module, the output port of each second multiplex module connecting with the input port of a corresponding register, the output port of the last register of the scan-chain connecting with the second input port of the first multiplex module corresponding to the first register of the scan-chain.

The present invention also provides a data collection system for said circuit state scan-chain. The data collection system comprises a snapshot control module, the snapshot control module controlling the first multiplex modules and the second multiplex modules for taking snapshot for operation states of the circuit state scan-chain.

As for said data collection system, the operation states of the circuit state scan-chain comprise normal mode, holding mode and snapshot mode.

As for said data collection system, the snapshot control module further comprises counters for controlling shifting times of values of the registers of the circuit state scan-chain.

The present invention also provides an emulation and verification method for the circuit state scan-chain or the data collection system. The emulation and verification method comprises the following steps: defining multiple detecting points on a test item; running the test item on a hardware emulation system; downloading input data at the time upon running the test item; taking snapshot at the detecting points; providing circuit states and the input data to a software simulation system, recurring behaviors of the design being tested on the hardware emulation system to the software simulation system.

DETAILED DESCRIPTION OF THE PREFERRED EMBODIMENT

The present invention links registers in the design being tested to a scan-chain by changing the logic of the design being tested, and controls operation modes (including normal mode, snapshot mode and holding mode) of the design being tested by outside signals. In addition, the scan-chain of the present invention has both ends linking with each other. After completion of snapshot, states of the design being tested are restored without extra time, whereby the test item is continued, increasing efficiency of emulation and verification.

Figure 1:
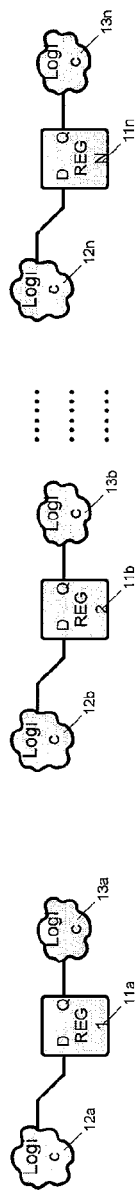
FIG. 1 is a simplified diagram of an initial logic of a design being tested.

Referring to FIG. 1, which is a simplified block diagram of initial logic of the design being tested. The design being tested comprises N registers 11 (shown as 11a, 11b, ..., 11n), corresponding input terminal combinational logic 12 (shown as 12a, 12b, ..., 12n), and corresponding output terminal combinational logic 13 (shown as 13a, 13b, ..., 13n). The registers 11 have input ports (D ports) and output ports (Q ports). Values of the output ports are the values stored in the registers, namely, states of the registers. The features of the registers are that, values of the output ports of the registers turn to values of the input ports of the registers by driving of a clock signal. As long as the registers are linked to constitute a scan-chain and are driven by the clock signals, values of these registers shift forward in order with the clock signals. The values of registers are received by the output port of a register at the end of the scan-chain. If backup registers are not provided to back up values of N registers of the design being tested, the logic of the design being tested itself needs to be changed. In order to retrieve the values of the registers, the N registers are connected to constitute a scan-chain, and states of the registers are output to outside by the scan-chain.

Figure 2:
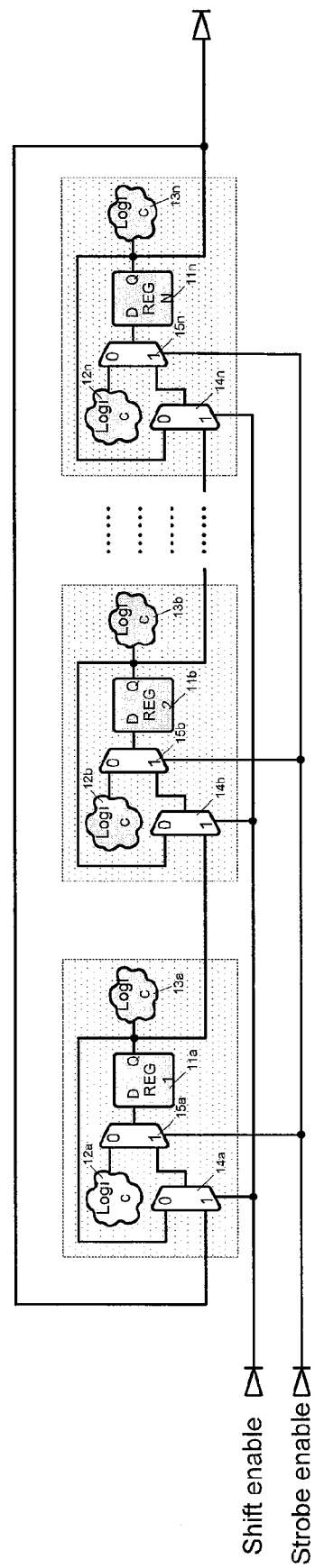
FIG. 2 is a simplified logic diagram of a design being tested of the present invention.

Referring to FIG. 2, which is a simplified logic block diagram of the design being tested. In the unit of a register, compared with initial logic of the design being tested, first multiplex modules 14 (shown as 14a, 14b, ..., 14n) and second multiplex modules 15 (shown as 15a, 15b, ..., 15n) are added. The register 11b is set as an example for explain how to form a scan-chain. The first multiplex module 14b and the second multiplex module 15b respectively have two input ports and one output port. The output port of the second multiplex module 15b connects with the input port of the register 11b. A first input port of the second multiplex module 15b connects with an output port of an input terminal combinational logic 12b. A second input port of the second multiplex module 15b connects with the output port of the first multiplex module 14b. A first input port of the first multiplex module 14b connects with an output port of the register 11b. A second input port of the first multiplex module 14b connects with an output port of a previous register 11a. An output port of a register 11n at the end of the scan-chain connects with a second input port of a first multiplex module 14a which corresponds to a register 11a at the beginning of the scan-chain. Such a scan-chain recycle is formed.

The first multiplex modules 14 are controlled by shift enable signal, and the second multiplex modules 15 are controlled by strobe enable signal. The relation of the two signals and operation modes of the design being tested are shown in the table below.

| strobe enable | shift enable | Operation mode |
| --- | --- | --- |
| 0 | 0 | Normal mode |
|  | 1 |  |
| 1 | 0 | Holding mode |
| 1 | 1 | Snapshot mode |

When strobe enable is 0, the second multiplex module 15 selects the input of the first input port (that is, the output of the input terminal combinational logic 12) for outputting. The output of the first multiplex module 14 is not chosen. Meantime the design being tested returns to initial logic functions and works under the normal mode.

When strobe enable is 1 and shift enable is 0, the second multiplex module 15 chooses the input of the second input port (that is, the output of the first multiplex module 14) for outputting. The first multiplex module 14 chooses the input of the first input port (that is, the output of the current register 11) for outputting. The current register remains unchanged, and the design being tested works under the holding mode. It will be described below when the design being tested should work under this mode.

When strobe enable is 1 and shift enable is 1, the second multiplex module 15 chooses the input of the second input port (that is, the output of the first multiplex module 14) for outputting. The first multiplex module 14 chooses the input of the second input port (that is, the output of a previous register 11) for outputting. With the system clock, the values of the registers shift forward in the scan-chain, and then are retrieved at the output port at the end of the scan-chain by clock sampling. All the values of the registers are retrieved after N clocks, and restore to initial states before shifting.

Figure 3:
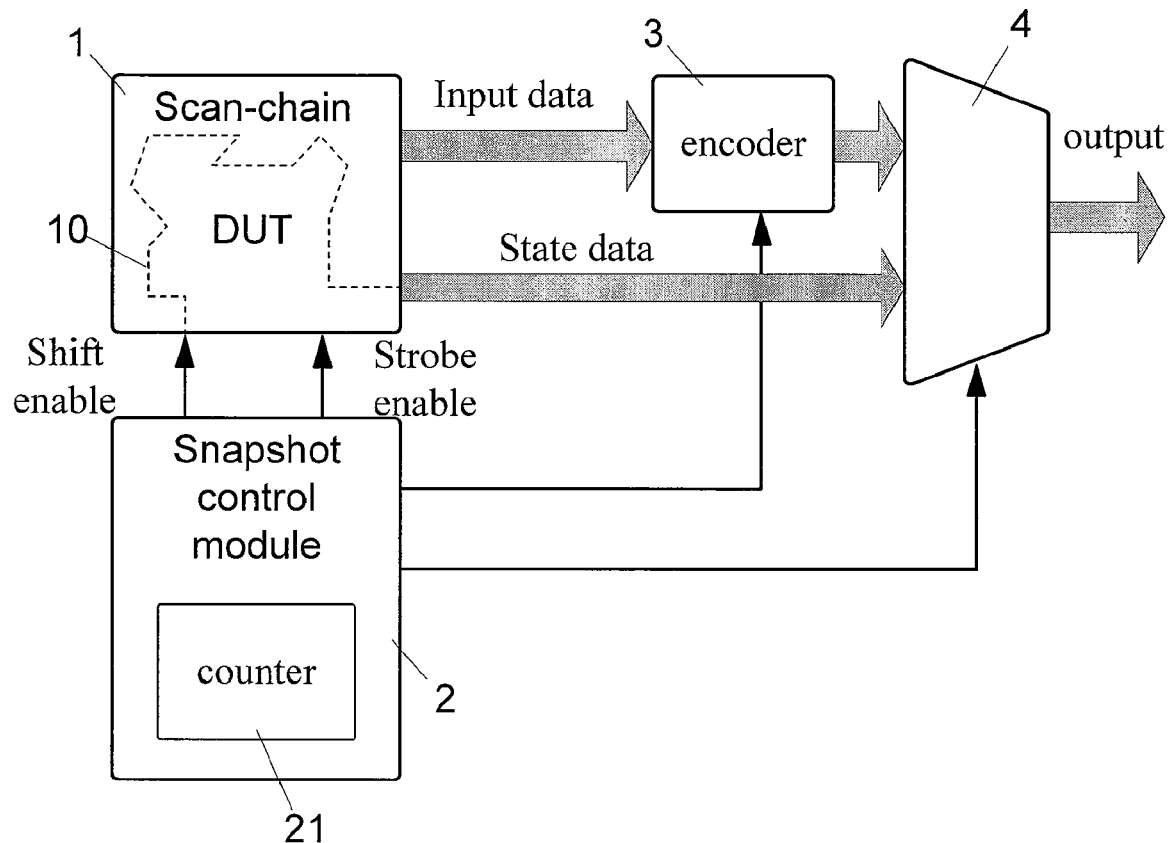
FIG. 3 is a simplified hardware diagram of a data collection system of the present invention.

Referring to FIG. 3, which is a simplified hardware diagram of a data collection system of the present invention. The data collection system includes a part of collecting circuit states (namely initial states) data and a part of input (namely input sequence) data. In the figure, input signals of the design being tested (DUT) 1 are transferred to an encoder 3, and are compressed by the encoder 3 to be output to a third multiplex module 4. A snapshot control module 2 controls operation modes of the design being tested 1, and in the meantime controls the encoder 3 and the third multiplex module 4. The scan-chain is not constructed with the backup registers, and therefore snapshot and test cannot work simultaneously. In other words, circuit states and the input data will not be uploaded at the same time. To reduce cost of hardware, a third multiplex module 4 makes the circuit states and the input data be uploaded through the same data path to external device according to this embodiment of the present invention. The circuit states and the input data may be uploaded separately through two data paths.

The exact circuit states data can be obtained only by precisely controlling shift times of the scan-chain 10. After snapshot, the registers 11 are restored to the states before snapshot. Firstly, it is demanded to determine how many registers 11 the scan-chain 10 have, which can be finished by analyzing RTL code of the design being tested with some logic analysis software (It is well know in the art). Secondly, shift times of the scan-chain 10 are controlled precisely, which is finished by the counter 21 in the snapshot control module 2. Software moves the number of the registers to the counter 21. When snapshot begins, the scan-chain 10 starts to shift. Corresponding to each shift, the counter 21 subtracts 1. As the counter 21 becomes 0, snapshot is finished, and the registers restore the states before snapshot. In the meantime the snapshot control module 2 stops snapshot by two signals of strobe enable and shift enable.

Some errors, such as overflow, may occur to the data collection system during data uploading. The scan-chain needs to temporarily halt data output. Otherwise during the period of overflow, the output data from the scan-chain will be lost, resulting in incomplete circuit state data. This issue may be overcome by combining the first multiplex module 14 and the second multiplex module 15. When the data upload path overflows or can not receive data in other situations, the system send signals to the snapshot control module 2. The snapshot control module 2 sets strobe enable to 1, and shift enable to 0. Input ports and output ports of the registers 11 are connected, the values of the registers maintain unchanged. The system goes on to output data of the registers in the scan-chain when the system restores to the normal state.

In addition, the circuit state data comprise register states and content of memory, for example SRAM. How to achieve values of the registers is crucial for the present invention and is described above. How to obtain content of memory is known to the skilled persons in the art, and therefore is not described here.

Figure 4:
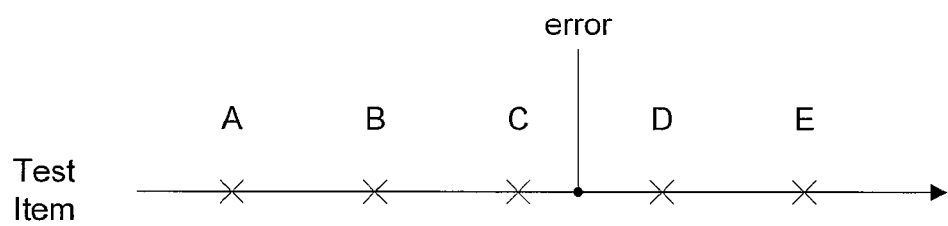
FIG. 4 is an exemplary diagram of detecting points on a test item of the present invention.

The structure of the scan-chain of the present invention is described above, and the emulation and verification method will be interpreted below. Referring to FIG. 4, which is a schematic view showing detected points on the test item. Above all, multiple detected points are set on the design being tested. For example, points A, B, C, D, E, are marks for snapshot (the design being tested runs on a hardware emulation system); when the design being tested runs to the detected points, the system temporarily stops input of the design being tested, sets strobe enable to 1 and shift enable to 0, and maintains the circuit states unchanged; when the system is ready to output circuit states, shift enable is set to 1, and the values of the registers 11 start to shift in the scan-chain 10; when the circuit states are output completely, the system restores input of the design being tested, setting the signal of strobe enable to 1, and restoring initial logic functions of the design being tested to run the design being tested again. After testing, input sequences and circuit states on five detected points A, B, C, D, E are recorded. If an error occurs between C and D, the circuit states of point C, as well as an input sequence between point C and D, are input to the software simulation system. This way, the software simulation system retrieves operation states of the design being tested on the hardware emulation system. The errors can be analyzed in detail and is fully visible by means of circuit states of the software simulation system. It is obvious that, as long as the circuit states on a detected point before an error and a corresponding input sequence are input to the software simulation system, this emulation and verification method does not lose the chance for analyzing errors in detail no matter when the errors occur.

The invention claimed is:

1. A circuit state scan-chain provided in a design being tested, said design comprising:
   a plurality of registers, and input terminal combinational logic and output terminal combinational logic respectively corresponding to each register, an output port of each register connecting with an input port of a corresponding output terminal combinational logic,
   wherein said circuit state scan-chain further comprises a plurality of first multiplex modules and a plurality of second multiplex modules respectively in correspondence with said plurality of registers, wherein each register is associated with a corresponding one of the plurality of first multiplex modules and a corresponding one of the plurality of second multiplex modules, each of the first multiplex modules and the second multiplex modules having two input ports and one output port, and wherein
   a first input port of each of the first multiplex modules connects with the output port of a corresponding register, and a second input port of each of the first multiplex modules connects with the output port of an immediately previous register,
   a first input port of each of the second multiplex modules connects with the output port of the input terminal combinational logic of a corresponding register, a second input port of each of the second multiplex modules connects with the output port of a corresponding one of the first multiplex modules, and the output port of each of the second multiplex modules connects with the input port of a corresponding register, and the output port of the last register of the scan-chain connects with the second input port of the first multiplex modules corresponding to the first register of the scan-chain.

2. A data collection system comprising:

a circuit state scan-chain, for collecting circuit states;

a snapshot control module, for controlling operation modes of said circuit state scan-chain, wherein said circuit state scan-chain comprises:

a plurality of registers, and input terminal combinational logic and output terminal combinational logic respectively corresponding to each register, an output port of each register connecting with an input port of a corresponding output terminal combinational logic, wherein said circuit state scan-chain further comprises a plurality of first multiplex modules and a plurality of second multiplex modules respectively in correspondence with said plurality of registers, wherein each register is associated with a corresponding one of the plurality of first multiplex modules and a corresponding one of the plurality of second multiplex modules, each of the first multiplex modules and the second multiplex modules having two input ports and one output port, and wherein a first input port of each of the first multiplex modules connects with the output port of a corresponding register, and a second input port of each of the first multiplex modules connects with the output port of an immediately previous register, a first input port of each of the second multiplex modules connects with the output port of the input terminal combinational logic of a corresponding register, a second input port of each of the second multiplex modules connects with the output port of a corresponding one of the first multiplex modules, and the output port of each of the second multiplex modules connects with the input port of a corresponding register, and the output port of the last register of the scan-chain connects with the second input port of the first multiplex modules corresponding to the first register of the scan-chain, wherein the snapshot control module controls said plurality of first multiplex modules and said plurality of second multiplex modules for taking snapshots of the operation modes of said circuit state scan-chain.

3. The data collection system as claimed in claim 2, wherein the operation modes of said circuit state scan-chain comprise normal mode, holding mode and snapshot mode.

4. The data collection system as claimed in claim 2, wherein the snapshot control module further comprises a counter for controlling shifting times of values in the registers in said circuit state scan-chain.

5. An emulation and verification method used with the circuit state scan-chain as claimed in claim 1, comprising:

defining a plurality of detecting points on a test item;
running the test item on a hardware emulation system;
downloading input data while running the test item;
taking snapshot at the detecting points;
providing circuit states and the input data to a software simulation system, recurring on the software simulation system behaviors of the design being tested on the hardware simulation system.

6. An emulation and verification method used with said data collection system as claimed in claim 2, comprising:

defining a plurality of detecting points on a test item;
running the test item on a hardware emulation system;
downloading input data while running the test item;
taking snapshot at the detecting points;
providing circuit states and the input data to a software simulation system, recurring on the software simulation system behaviors of the design being tested on the hardware simulation system.

7. A data collection system for taking snapshots for a design being tested, comprising:

a circuit state scan-chain for collecting circuit states, said circuit state scan-chain comprising a plurality of registers, and input terminal combinational logic and output terminal combinational logic respectively corresponding to each register;

a snapshot control module for controlling operation modes of the circuit state scan-chain, wherein a first multiplex module and a second multiplex module are provided for each register, said snapshot control module controls the first multiplex modules and the second multiplex modules, so that the circuit state scan-chain can be switched among normal mode, holding mode and snapshot mode and;

wherein under the snapshot mode, the registers constitute a scan-chain loop to output values of the registers of the scan-chain; under the holding mode, values in the registers remain unchanged; and under the normal mode, the design being tested returns to original logic functions.

* * * * *